(12) United States Patent
Lee et al.

(10) Patent No.: US 9,653,137 B2
(45) Date of Patent: May 16, 2017

(54) STT-MRAM BITCELL FOR EMBEDDED FLASH APPLICATIONS

(71) Applicant: GLOBALFOUNDRIES Singapore Pte. Ltd., Singapore (SG)

(72) Inventors: Kangho Lee, San Diego, CA (US); Eng Huat Toh, Singapore (SG); Jack Tim Wong, Fremont, CA (US); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/095,170

(22) Filed: Apr. 11, 2016

(65) Prior Publication Data

US 2016/0300604 A1  Oct. 13, 2016

Related U.S. Application Data (60) Provisional application No. 62/146,220, filed on Apr. 10, 2015.

(51) Int. Cl.
| | | |
|---|---|---|
| *G11C 11/00* | (2006.01) | |
| *G11C 11/16* | (2006.01) | |
| *H01L 27/22* | (2006.01) | |

(52) U.S. Cl.
CPC ...... *G11C 11/1675* (2013.01); *G11C 11/1659* (2013.01); *H01L 27/228* (2013.01); *G11C 11/1655* (2013.01)

(58) Field of Classification Search
CPC . G11C 11/16; G11C 11/1655; G11C 16/1675; G11C 13/0002; G11C 13/0004; G11C 13/0069; H01L 27/228

USPC ........... 365/158, 63, 148, 163, 171
See application file for complete search history.

(56) References Cited

U.S. PATENT DOCUMENTS

| | | | | |
|---|---|---|---|---|
| 2014/0071732 | A1* | 3/2014 | Khalili Amiri | ....... G11C 11/161 365/145 |
| 2014/0169086 | A1* | 6/2014 | Kim | ....... G11C 11/161 365/158 |
| 2015/0179256 | A1* | 6/2015 | Kitagawa | ........... G11C 13/0069 365/148 |
| 2015/0357032 | A1* | 12/2015 | Tatsumura | ......... H03K 19/1776 365/72 |

* cited by examiner

*Primary Examiner* — Tan T. Nguyen
(74) *Attorney, Agent, or Firm* — Horizon IP Pte. Ltd.

(57) ABSTRACT

A spin transfer torque magnetic random access memory (STT-MRAM) device and a method to perform operations of an embedded eFlash device are disclosed. The STT-MRAM device is configured to include an array of STT-MRAM bitcells. The array includes a plurality of bitlines (BLs) and a plurality of word lines (WLs), where the bitlines form columns and the wordlines form rows of STT-MRAM bitcells. Each STT-MRAM bitcell includes a magnetic tunnel junction (MTJ) element coupled in series to an access transistor having a gate terminal and source and drain terminals. The array includes a plurality of source lines (SLs) coupled to the source terminals of the access transistors. A SL of the plurality of SLs is coupled to source terminals of access transistors of two or more adjacent columns of the STT-MRAM cells. The shared SL is parallel to the plurality of BLs. The operations of such a STT-MRAM bitcell are configured to include: an initialization operation, a program operation, and a sector erase operation.

20 Claims, 8 Drawing Sheets

STT-MRAM BITCELL FOR EMBEDDED FLASH APPLICATIONS

CROSS-REFERENCE TO RELATED APPLICATION

This application claims the benefit of and priority to U.S. Provisional Patent Application No. 62/146,220, filed Apr. 10, 2015, which is hereby incorporated by reference in its entirety.

BACKGROUND

It is likely that spin transfer torque magnetic random access memory (STT-MRAM) devices may replace widely used CMOS based memory devices in non-volatile memory applications. STT-MRAM chips typically include an array of STT-MRAM memory cells. Each STT-MRAM memory cell typically includes a magnetic tunnel junction (MTJ) memory element and an access (or select) transistor.

In embedded non-volatile memory applications, it has been common practice to use embedded flash (eFlash) memory. While STT-MRAM decreases write energy compared to eFlash, it may be desirable to reduce STT-MRAM cell size without degrading read energy and speed.

From the foregoing discussion, it is desirable to provide cost effective, smaller sized, and power efficient STT-MRAM devices in memory applications such as embedded flash (eFlash) replacement.

SUMMARY

Embodiments in the present disclosure relate to magnetic devices, in particular STT-MRAM memory devices used in low-cost and low-power, eFlash replacement applications. At 40-nm technology node and above, eFlash is prevalent in many applications ranging from microcontrollers to secure key storage in smartcards. However, at advanced technology nodes, finding a viable eFlash solution has been challenging since most eFlash products based on floating gate/charge trapping technology may not be scalable below 28-nm.

In one embodiment, a spin transfer torque magnetic random access memory (STT-MRAM) device and a method of building STT-MRAM bitcell array are disclosed to realize low-cost and power-efficient eFlash replacement devices. The array includes a plurality of N number of bitlines (BLs) having M number of STT-MRAM cells, where the bitlines form N columns of STT-MRAM cells. Each STT-MRAM cell includes a magnetic tunnel junction (MTJ) element having first and second MTJ terminals, and an access transistor having a gate, source and drain terminals, where the drain terminal is coupled to the first MTJ terminal, providing a series coupling between the access transistor with the MTJ element. The array includes a plurality of M number of word lines (WLs) coupled to the gates of the access transistors of the STT-MRAM cells of the array. A WL is coupled to one STT-MRAM cell in each of the N bitlines to form a row of STT-MRAM cells, where the plurality of M number of WLs form M rows of STT-MRAM cells. The array also includes a plurality of S number of source lines (SLs) coupled to source terminals of the access transistors. A SL of the S number of SLs is coupled to the source terminals of access transistors of two or more adjacent columns of the N columns of STT-MRAM cells. The shared SL is parallel to the N number of BLs.

In another embodiment, a spin transfer torque magnetic random access memory (STT-MRAM) device is presented. The STT-MRAM device includes a first bitline having M number of STT-MRAM cells and a second bitline having M number of STT-MRAM cells. The first and second bitlines form first and second columns of STT-MRAM cells. A STT-MRAM cell includes a magnetic tunnel junction (MTJ) element having first and second MTJ terminals, and an access transistor having a gate, source and drain terminals, where the drain terminal is coupled to the first MTJ terminal, providing a series coupling between the access transistor with the MTJ element. The STT-MRAM device includes a plurality of M number of wordlines (WLs) coupled to the gate terminals of the access transistors of the STT-MRAM cells. A WL is coupled to one STT-MRAM cell in the first and second bitlines to form a row of STT-MRAM cells, where the plurality of M number of WLs form M rows of STT-MRAM cells. The STT-MRAM device also includes a source line (SL) coupled to the source terminals of the access transistors of the STT-MRAM cells of the first and second columns of STT-MRAM cells, where the SL is shared by the first and second columns of STT-MRAM cells. The shared SL is parallel to the first and second bitlines.

In yet another embodiment, a method to perform eFlash operations in a STT-MRAM is disclosed. An array of bitcells of the STT-MRAM device is configured by using a parallel source line, bit line (SL//BL) structure, where each bitcell is configured to include a magnetic tunnel junction (MTJ) cell coupled in series to an access transistor, and a word line (WL) being coupled to the gate of the access transistor. The SL//BL structure is configured to include a source line (SL) shared between bits of adjacent BLs. Driving BL with SL grounded allows selectively writing a logical H value as in the program operation in eFlash. Driving SL with all the BLs grounded performs the erase operation as in eFlash. The bits sharing a common SL are erased and reset to logical L values. By sequentially performing the erase operation across one sector, the sector erase operation as in eFlash can be performed. The shared SL makes the erase operation more efficient. The read operation is not affected and small read bias is applied to a selected BL with SL grounded.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The drawings are not necessarily to scale, emphasis instead generally being placed upon illustrating the principles of the invention. The accompanying drawings, which are incorporated in and form part of the specification in which like numerals designate like parts, illustrate preferred embodiments of the present disclosure and, together with the description, serve to explain the principles of various embodiments of the present disclosure.

DETAILED DESCRIPTION

Embodiments of the present disclosure generally relate to spin transfer torque magnetic random access memory (STT-MRAM) devices. The STT-MRAM devices may be implemented as a chip or may be embedded in various electronic devices. STT-MRAM devices are programmed with an electrical current and not with an external magnetic field. Described herein are low cost, and power efficient STT-MRAM bitcell architectures that are suitable for embedded flash (eFlash) replacement. The STT-MRAM devices described in this disclosure may be incorporated into or used with, for example, automotive microcontrollers, smart cards, and a variety of consumer and industrial microcontroller applications. The devices may also be incorporated into, for example, consumer electronic products, such as computers, smart phones, wireless electronic devices like watches, cameras and printers, GPS and several types of tablet computing devices. Incorporating the devices in other applications may also be useful.

Descriptive and directional terms used in the written description such as top, bottom, left, right, upstream, downstream, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

In an embodiment, the STT-MRAM device of the present disclosure is configured to include an array of STT-MRAM bitcells (or cells) having a plurality of N number of bitlines (BLs) with M number of STT-MRAM cells, where the bitlines form N columns of STT-MRAM cells. Each STT-MRAM cell includes a magnetic tunnel junction (MTJ) element having first and second MTJ terminals, and an access transistor having a gate, source and drain terminals, where the drain terminal is coupled to the first MTJ terminal, providing a series coupling between the access transistor with the MTJ element. The array includes a plurality of M number of word lines (WLs) coupled to the gates of the access transistors of the STT-MRAM cells of the array. A WL is coupled to one STT-MRAM cell in each of the N number of bitlines to form a row of STT-MRAM cells, where the plurality of M number of WLs form M rows of STT-MRAM cells. The array also includes a plurality of S number of source lines (SLs) coupled to source terminals of the access transistors. A SL of the S number of SLs is coupled to the source terminals of access transistors of two or more adjacent columns of the N columns of STT-MRAM cells. The shared SL is parallel to the plurality of BLs. Details and operations of the STT-MRAM device will be illustrated in the following paragraphs with reference to FIGS. 1A-1E and FIGS. 2A-2B.

Figure 1A:
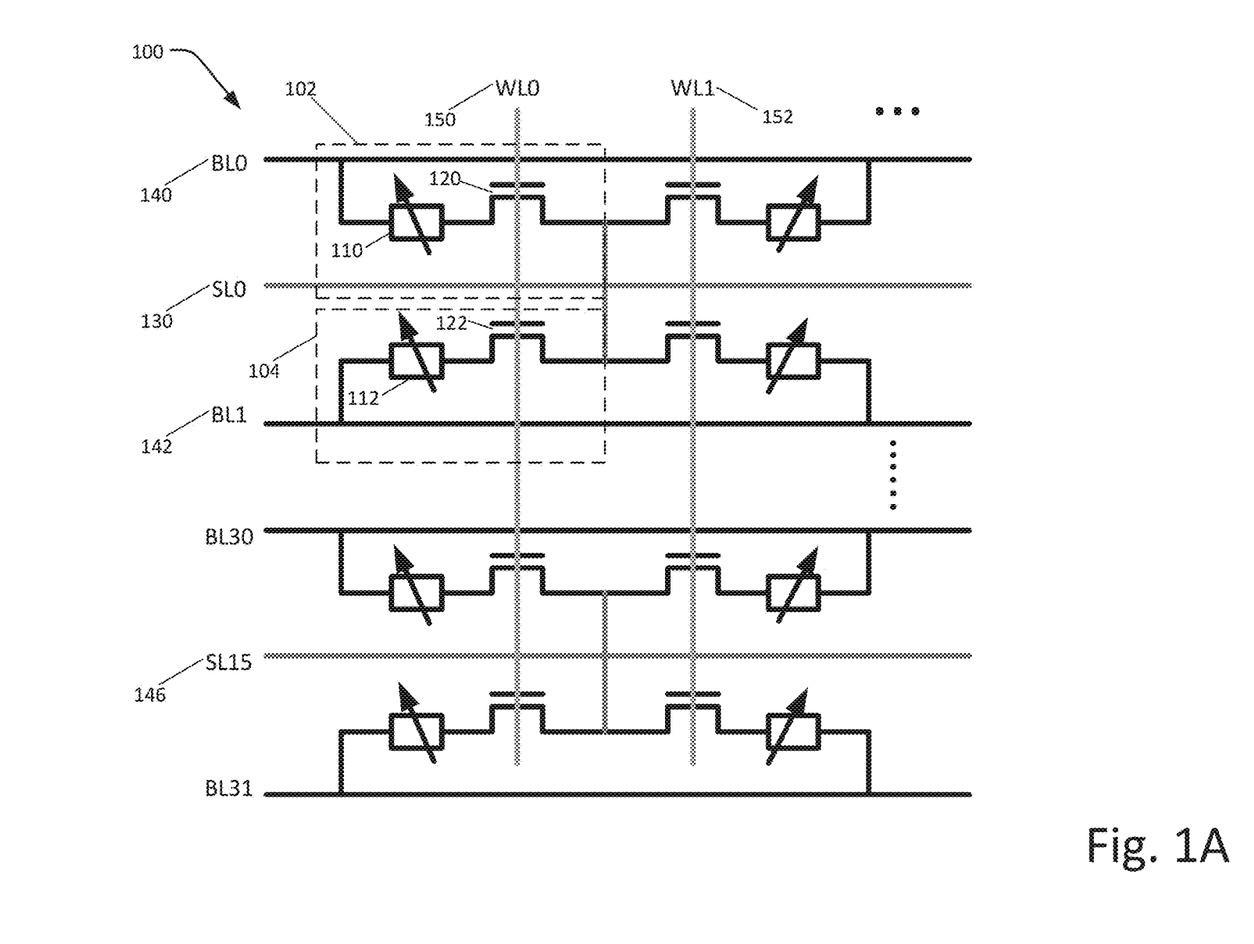
FIG. 1A illustrates a simplified circuit diagram of an embodiment of a portion of a STT-MRAM device configured to perform operations as an eFlash replacement device.

FIG. 1A illustrates a simplified circuit diagram of an embodiment of a portion of a STT-MRAM device 100 configured to perform operations of an eFlash device. In the depicted embodiment shown in FIG. 1A, the STT-MRAM device 100 is configured as an eFlash replacement device with bits or bitcells of two adjacent bitlines (e.g, BL0 140 and BL1 142) sharing one source line (e.g., SL0 130) and the SL is parallel to the BL.

The STT-MRAM device 100 is configured to have an array having a plurality of bitcells (or cells). The array includes a plurality of N number of bitlines (BLs), where the bitlines form N columns of bitcells and a plurality of M number of word lines (WLs), where the WLs form M rows of bitcells. Thus, the bitcell may be individually identified by bitcell (column, row). In an embodiment, all bitcells may be configured to be identical to one another. For example, bitcell (0,0) 102 is configured to include: a magnetic tunnel junction (MTJ00) element 110 coupled to drain terminal of an access transistor (T00) 120 which provides a series connection between the MTJ element and the access transistor; a source line (SL0) 130 coupled to the source terminal of the access transistor T00 120; a bit line (BL0) 140 coupled to the MTJ00 element 110; and a word line (WL0) 150 coupled to a gate of the access transistor T00 120. Similarly, an identical bitcell, bitcell (1,0) 104 which is adjacent to bitcell (0,0) is configured to include: a magnetic tunnel junction (MTJ10) element 112 coupled to drain terminal of an access transistor (T10) 122 which provides a series connection between the MTJ element and the access transistor; the source line (SL0) 130 coupled to the source terminal of the access transistor T10 122; a bit line (BL1) 142 coupled to the MTJ10 element 112; and the word line (WL0) 150 coupled to a gate of the access transistor T10 122.

In an embodiment, each source line (e.g., SL0 130) of the array may be shared between multiple bitcells or bits, e.g., shared between bitcells of the BL0 140 and at least one adjacent bitline (e.g., BL1 142). The BL0 140 and the at least one adjacent bitline (e.g., BL1 142) is disposed on either side of the SL0 130. The BL0 140, the SL0 130 and the at least one adjacent bit line BL1 142 are configured to be parallel to one another. Thus, the STT-MRAM device 100 is described to use a SL//BL structure. The access transistors (e.g., T00 120, T10 122, and others) are switched (or asserted) for performing both read and write operations to allow current to flow through the corresponding MTJ elements (e.g., MTJ00 110, MTJ10 112, and others), so that the logic state of the MTJ element can be read or written by the read/write circuit (not shown) and the Sense Amplifier (not shown).

Each one of the N number of bitlines (e.g., columns BL0 to BL31) is coupled to M (e.g., WL0 150 and WL1 152) ones of the MTJ elements, each MTJ being configured to store a logical high (H) or low (L) value by controlling the voltage levels of the corresponding source line, bit line and word line, (e.g., controlling SL0 130, the BL0 140 and the WL0 150 for writing a logical H or L to MTJ00 110). A memory state stored in the MTJ bitcell may be detected by measuring difference in MTJ resistance (e.g., $R_{AP}$ and $R_P$) using peripheral circuitry for the N×M array such as a read/write driver circuit and a Sense Amplifier (SA) for each SL and bitline pair (e.g., circuits associated with BL0 140, BL1 142 and SL0 130). $R_{AP}$ refers to the corresponding MTJ electrical resistance when the magnetization of the free layer is programmed to be in anti-parallel direction as the reference layer of the MTJ element while $R_P$ refers to the corresponding MTJ electrical resistance when the magnetization of the free layer is programmed to be in parallel direction as the reference layer of the MTJ element. Sense Amplifier (SA) may be used to sense resistance differences between MTJ states and a reference signal. The reference signal may be generated by averaging the read currents that correspond to $R_P$ and $R_{AP}$ respectively.

Two or more adjacent columns of bitcells (or cells) may be configured to share 1 source line. In the depicted embodiment, the number of the source lines is equal to N/2 (e.g., columns SL0 130 to SL15 146). The sharing of the SL0 130 between bitcells of at least two adjacent bit lines (e.g., BL0 140 and BL1 142) advantageously results in a reduction of chip area compared to having bitcell structure with a SL dedicated to a BL. It is understood that the column orientation of the BL and the row orientation of the WL is for convenience and the column and row orientations of the BL and WL may be swapped.

In one embodiment, the source terminals of adjacent access transistors of the same BL are a common source terminal to form a pair of STT-MRAM cells of a bitline as shown in FIG. 1A. In other embodiments, the source terminals of adjacent access transistors of the same BL may be configured as separate source terminals. Further, as illustrated, the array includes even number of BLs. There may be instances where odd number of BLs are provided in the array. In such case, one of the BLs may have its own SL. Other suitable configurations for the array may also be useful.

To minimize the bitcell size, the SL sharing architecture (where SL is perpendicularly oriented relative to BL) may be preferred over the dedicated SL architecture (where orientation of SL and BL are parallel) due to logic design rules. The SL sharing architecture is typically used in conventional eFlash. However, sharing SL across one sector is not applicable to STT-MRAM devices since STT-MRAM technology is based on current-induced magnetization switching and erasing across a page may require excessive current.

For the dedicated SL architecture (where orientation of SL and BL are parallel and a SL is dedicated to each BL), which may be used and preferred for SRAM, interconnect resistance from narrow SL (M1) may become quite substantial when a bit is away from SA and it makes the total resistance of the read path location-dependent. For configuring the minimum-size bitcell with the dedicated SL architecture, this option (where orientation of SL and BL are parallel and a SL is dedicated to each BL) can significantly degrade the read/write margins for mid-point referencing because all the parasitic resistive components in the read path degrade effective resistance difference between two states from the Sense Amplifier point of view.

For the STT-MRAM 100 device with SL and BL that are parallel and a SL is shared between multiple bits of two or more adjacent BLs, the value of the number of bits shared with one SL may be configured to be a function of a number of factors such as read/write margins, write driver capacity, bit cell size/layout constraints, technology node, and others. In the depicted embodiment, 2 bit lines may be selected based on application requirements and/or based on capacity rating of the read/write driver circuit to be able to provide sufficient current to BL0 140 and BL1 142 sharing the same SL0 130. The value of the number of bits shared with one SL may also be determined based on simulation modeling data. For example, the current may be sufficient to cause the MTJ00 110 and the at least one adjacent (e.g., MTJ10) 112 to change an operating state in response to performing the memory operations.

In an embodiment, the memory operations are configured to include: a program operation, a sector erase operation, and an initialization operation. Typically, writing to a randomly accessible bitcell location of the N×M array is only permitted in the program operation of the eFlash. The eFlash memory does not typically allow writing to a randomly accessible bitcell location in sector erase or initialization operations. Additional details of operation of the STT-MRAM device 100 as eFlash replacement device is described with reference to FIGS. 1B, 1C, 1D and 1E.

Figure 1B:
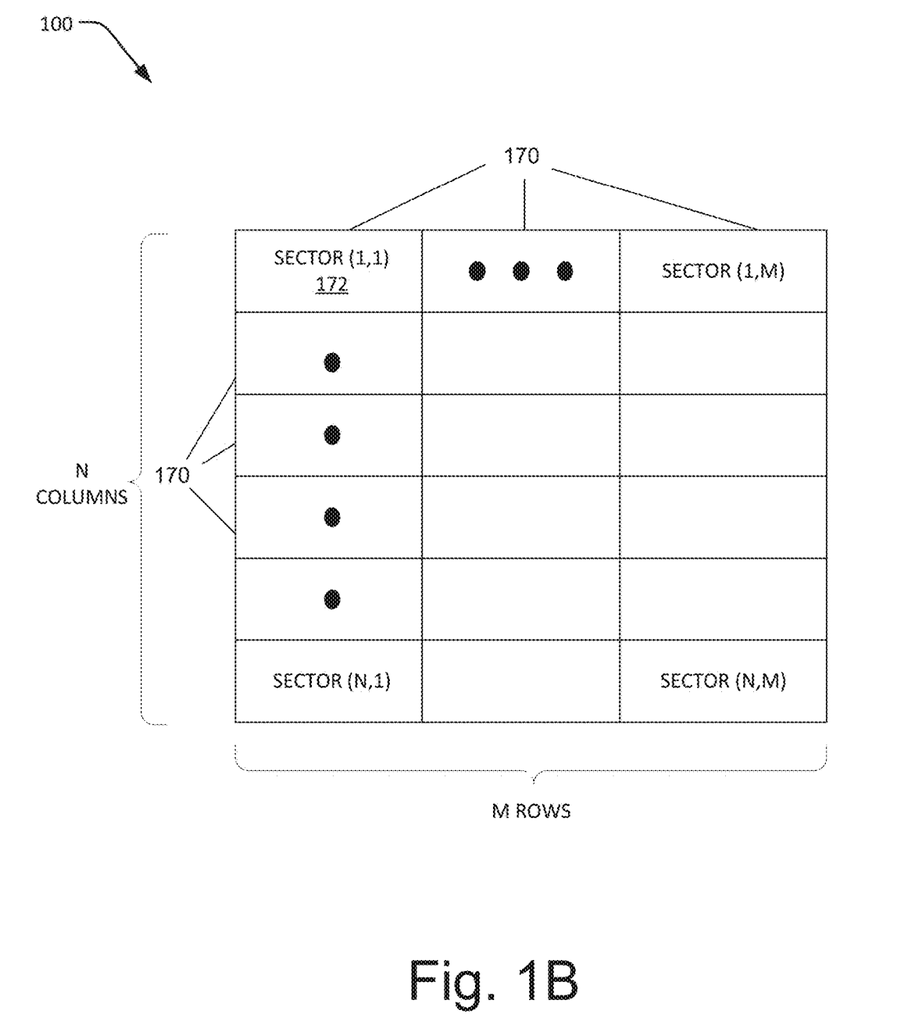
FIG. 1B illustrates a simplified block diagram of an embodiment of a portion of a STT-MRAM device configured to include a plurality of sectors.

FIG. 1B illustrates a simplified block diagram of an embodiment of a portion of a STT-MRAM device 100 configured to include a plurality of sectors 170. A portion of the N×M array may be formed to configure a sector 172 (may also be referred to as a segment or a block). The benefit of having the plurality of sectors 170 is that the STT-MRAM device 100 is sector-erasable to perform the eFlash memory. That is, the STT-MRAM device 100 supports an erase operation that erases one sector at a time instead of erasing each bitcell at a time to dramatically improve performance. In an embodiment, the erase operation may include erasing or resetting each bitcell in the sector 172 to a logical L value. For example, the erase operation may include writing a logical L value to each bitcell in the sector 172.

Figure 1C:
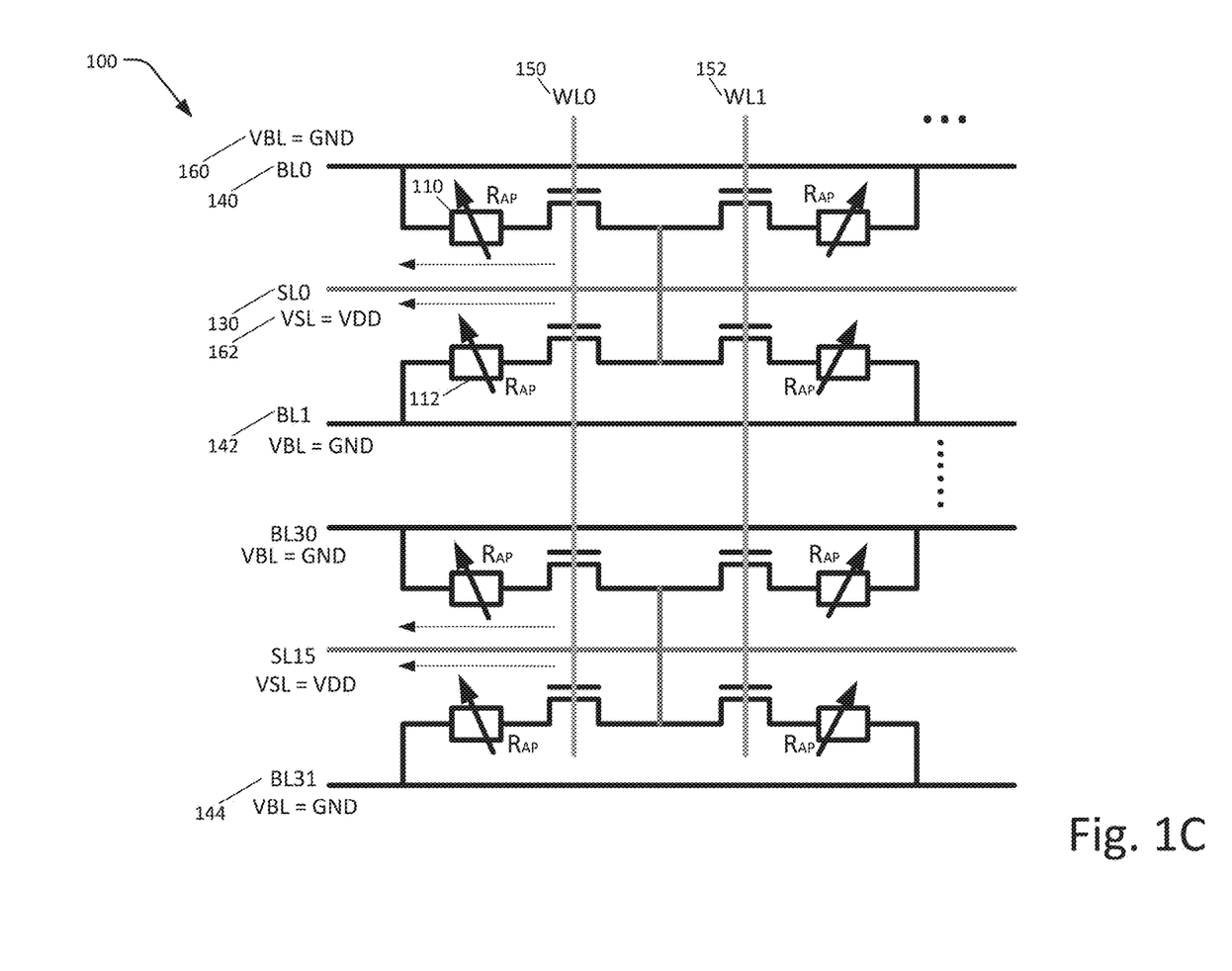
FIG. 1C illustrates a simplified circuit diagram of an embodiment of a portion of a STT-MRAM device configured to perform an initialization operation as an eFlash replacement device.

FIG. 1C illustrates a simplified circuit diagram of an embodiment of a portion of a STT-MRAM device 100 configured to perform an initialization operation of an eFlash device. In an initialization operation, each bitcell of the array may be configured to store a logical H value (e.g., logical 1). For example, the MTJ00 110 may be configured to store the logical H value when magnetization in the free layer and the reference layer are anti-parallel (AP) and value of MTJ resistance $R_{AP}$ is high. Conversely, the MTJ00 110 may be configured to store the logical L value when magnetization in the free layer and the reference layer are parallel (P) and value of MTJ resistance $R_P$ is low. Other configurations of the MTJ00 110 for storing a logical value may also be useful.

The STT-MRAM device 100 may be initialized by coupling the N number of the bitlines (e.g., BL0 140 to BL31 144) to a low level voltage reference 160 (e.g., ground GND), coupling the N/2 ones of the source lines (e.g., SL0 130 and SL1 (not shown)) to a high level voltage supply source 162 (e.g., VDD), and asserting in sequence each one of the M ones of the word lines (e.g., WL0 150 to WL1 152). The flow of current from the SL0 130 through the MTJ00 110 and the at least one adjacent MTJ10 112 to BL0 and BL1 causes the magnetization in the free layer and the reference layer of the MTJ to be anti-parallel (AP), thereby writing a logical H value to the MTJ00 110 and the at least one adjacent MTJ10 112. Concurrently, other MTJ elements coupled to remaining bit lines, e.g., BL(N−1) and BL(N) are also switched to an AP state. This operation is repeated by asserting WL1 152 and other M ones of the WLs of the N×M array in a sequential manner.

Sector erase and initialization operations are similar except for writing to a selected one of the sectors versus writing to all sectors in one command. That is, erasing an eFlash device typically includes erasing and resetting an entire sector of bitcells at a time to a logical L value (e.g., logical 0) while initializing an eFlash device typically includes writing a logical H value (e.g., logical 1) to the entire memory array.

Figure 1D:
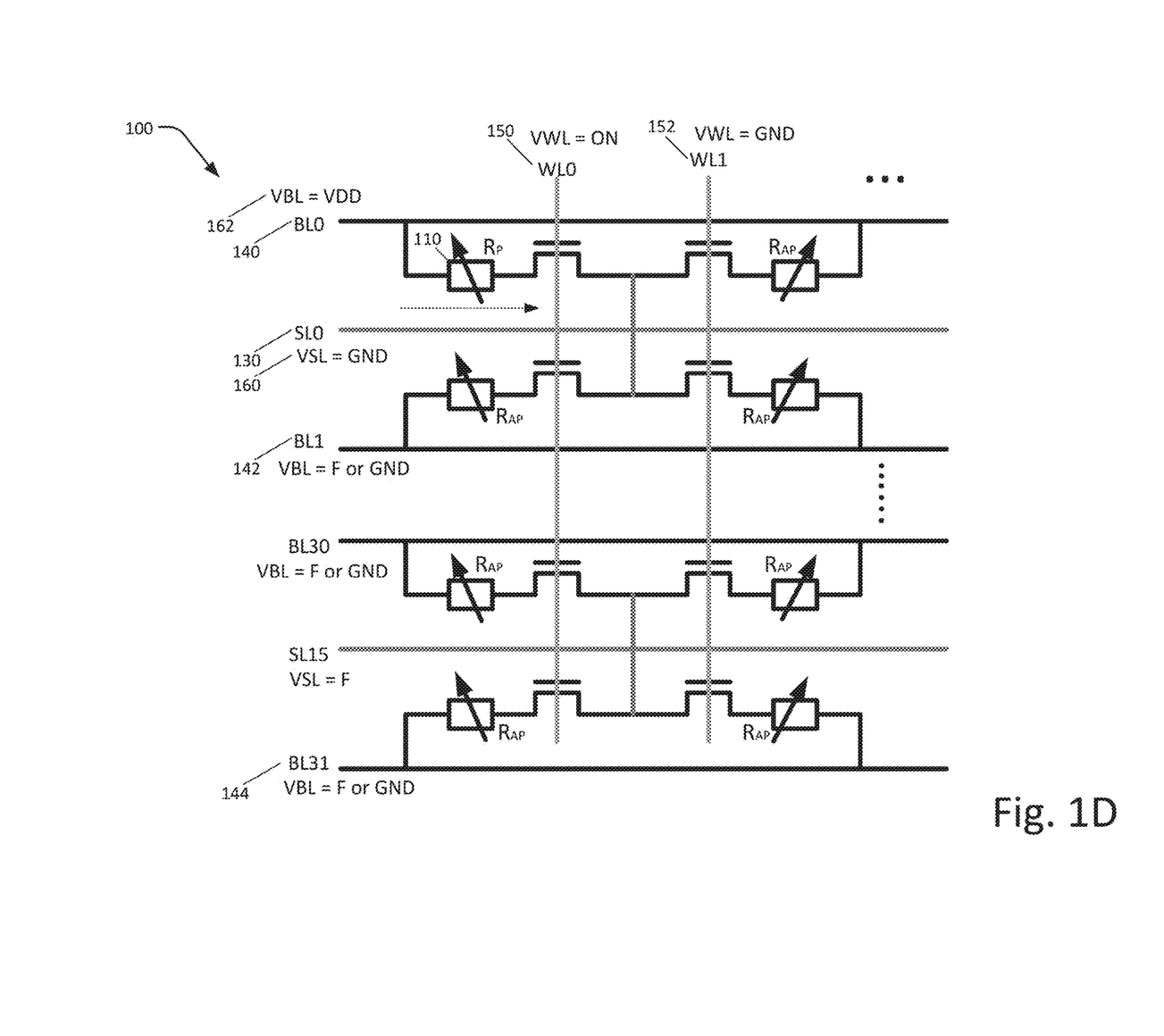
FIG. 1D illustrates a simplified circuit diagram of an embodiment of a portion of a STT-MRAM device configured to perform a program operation as an eFlash replacement device.

FIG. 1D illustrates a simplified circuit diagram of an embodiment of a portion of a STT-MRAM device 100 configured to perform a program operation of an eFlash device. An eFlash device is typically programmed to write a logical L value (e.g., logical 0) to a randomly accessible bitcell location of the memory device. Prior to performing the program operation, the array is initialized as described with reference to FIG. 1C. Each one of the bitcells of the array stores a logical H value. In a program operation, any randomly accessible bitcell location in the N×M array is configured to store a logical L value (e.g., logical 0). Therefore, the program operation performs a unidirectional write operation (logical 1 to logical 0) during the normal byte-writable write operation of the STT-MRAM 100.

In an embodiment, for illustration purpose, the randomly accessible bitcell location is selected to be the MTJ00 110 coupled to BL0 140. The program operation is performed by coupling the BL0 140 to a high level voltage reference 162 (e.g., VDD), coupling the SL0 130 to a low level voltage supply source reference 160 (e.g., ground GND), and asserting the WL0 150. The flow of current from the BL0 140 through the MTJ00 110 to SL0 130 causes the magnetization in the free layer and the reference layer of the MTJ00 110 to be parallel (P), thereby writing a logical L value to the MTJ00 110. During the program operation, only the randomly accessible bitcell (0,0) 102 and MTJ00 110 are affected and other bitcells and MTJs of the array remain unaffected.

Figure 1E:
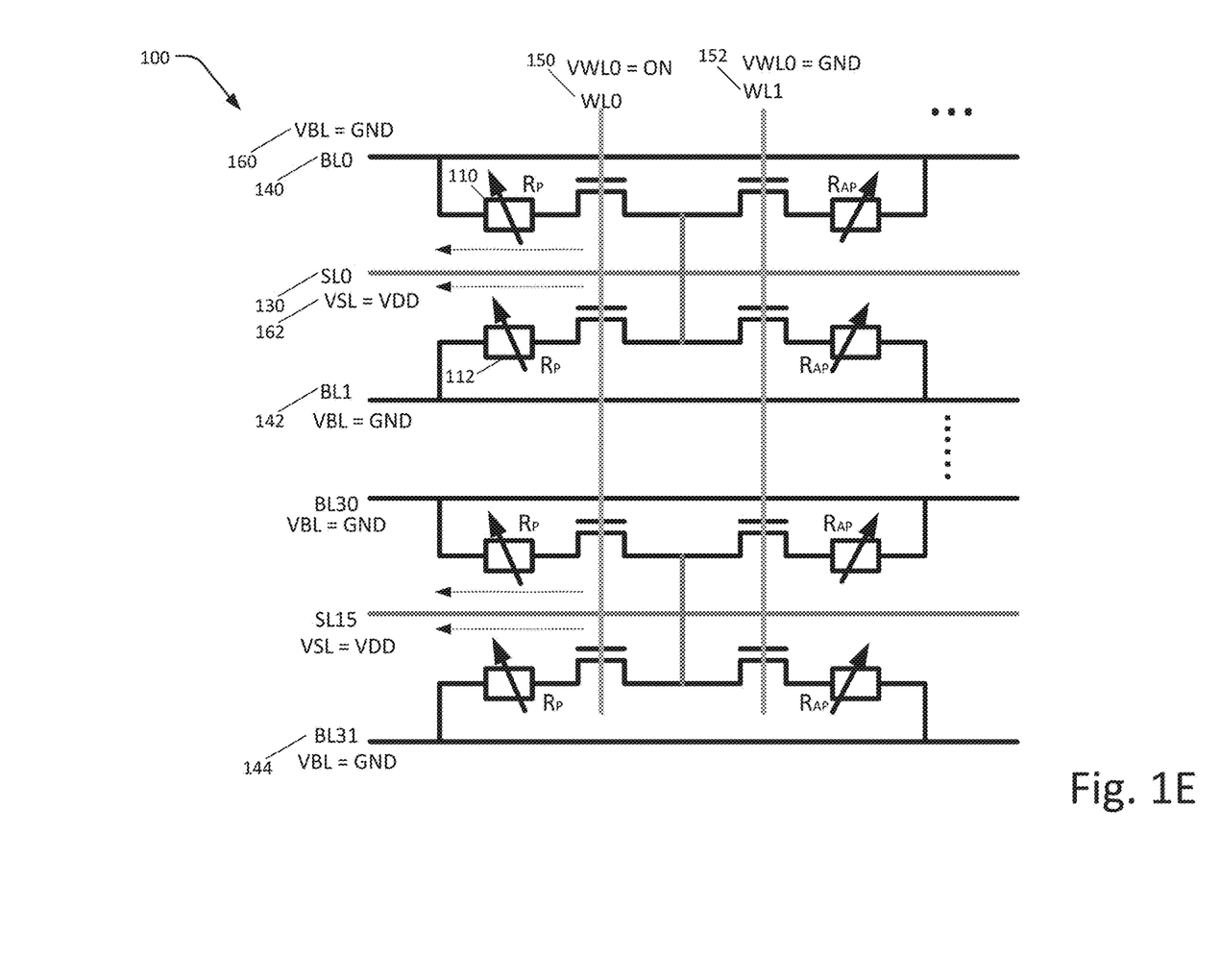
FIG. 1E illustrates a simplified circuit diagram of an embodiment of a portion of a STT-MRAM device configured to perform a sector erase operation as an eFlash replacement device.

FIG. 1E illustrates a simplified circuit diagram of an embodiment of a portion of a STT-MRAM device 100 configured to perform a sector erase operation of an eFlash device. Referring to FIGS. 1B and 1E, in a sector erase operation, each bitcell of a selected sector (e.g., sector 172) of the plurality of sectors 170 is configured to be erased and reset to a logical L value (e.g., logical 0). The sector erase operation does not require random access since it resets every bit in the selected sector (e.g., sector 172) to a logical L value. For example, driving SL with N ones of BLs grounded erases all the bits sharing the SL as in the eFlash erase operation.

The sector 172 may be initialized by coupling the N ones of the bitlines (e.g., BL0 140 to B31 144) to a low level voltage reference 160 (e.g., ground GND), coupling the N/2 ones of the source lines (e.g., SL0 130 and SL1) to a high level voltage supply source 162 (e.g., VDD), and asserting in sequence each one of the P ones of the word lines (e.g., WL0 150 to WL1 152) that are included in the sector 172, where P being an integer not greater than M. The flow of current from the SL0 130 through the MTJ00 110 and the at least one adjacent MTJ10 112 to BL0 and BL1 causes the magnetization in the free layer and the reference layer of the MTJ element to be parallel (P), thereby writing a logical L value to the MTJ00 110 and the at least one adjacent MTJ10 112. Concurrently, other MTJs coupled to remaining bit lines, e.g., BL(N−1) and BL(N) are also switched to a parallel state. This operation is repeated by asserting WL1 and other P ones of the WLs of the sector 172 in a sequential manner. Thus, as described earlier, performing the sector erase operation and performing the initialization operation is similar except for the number of sectors being written to.

Figure 2A:
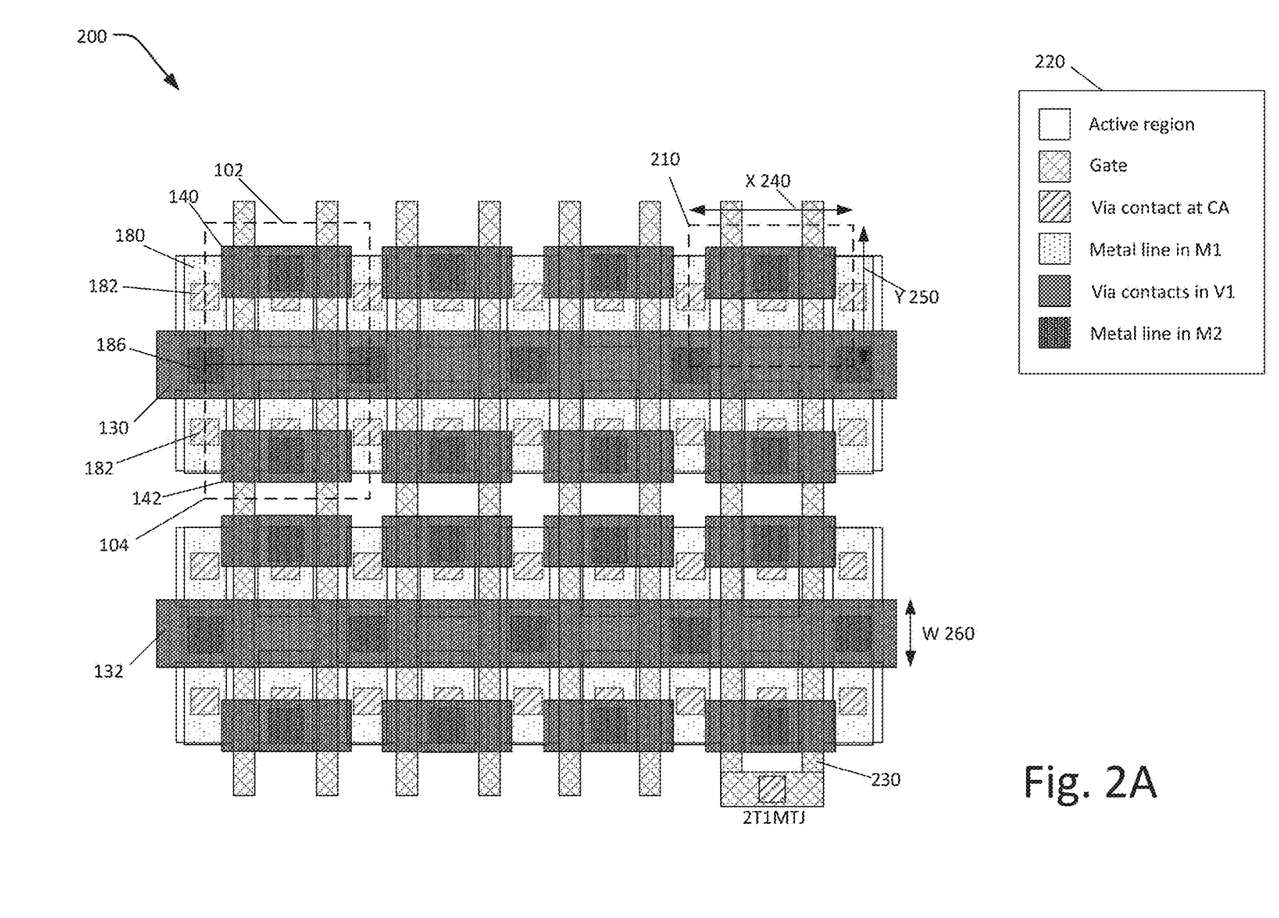
FIG. 2A illustrates a simplified layout diagram of a STT-MRAM device described with reference to FIGS. 1A, 1B, 1C, 1D, and 1E.

FIG. 2A illustrates a simplified layout diagram 200 of a STT-MRAM device 100 described with reference to FIGS. 1A, 1B, 1C, 1D, and 1E. Various layers disposed in the different levels of the STT-MRAM device are illustrated by key or legend 220. In the depicted embodiment, each one of the bitcells of the array may be configured as a 1T1MTJ bitcell 210 with a shared SL//BL structure. As an example and for illustration purpose only, the source terminals of access transistors of adjacent columns of bitcells are coupled to a common metal line in M1 level through via contacts in the pre-metal dielectric (PMD) or CA level. The metal line M1, for example, is disposed in a perpendicular direction with respect to the BLs and SLs. The common metal line in M1 is coupled to a metal line which serves as the SL disposed in an upper metal level M2 through a via contact disposed in V1 level. Thus, such configurations allows the SL to be shared between bitcells of adjacent bitlines.

By way of an example and not limiting thereto, the SL0 130 which is disposed in metal level M2 is shared between adjacent columns of bitcells (e.g., bitcells 102 and 104, and others). As shown in FIG. 2A, the source regions of access transistors of adjacent column of bitcells (e.g., bitcells 102 and 104) are coupled to a common metal line 180 in M1 level through via contacts 182 in the PMD or CA level. As shown, the common metal line in M1 level, for example, is disposed in a perpendicular direction with respect to the BLs (e.g., BL0 140, BL1 142) and SLs (e.g., SL0 130). The common metal line 180 in M1 is coupled to a metal line which serves as the SL (e.g., SL0 130) disposed in an upper metal level M2 through a via contact 186 disposed in V1 level. Thus, such configuration allows the SL0 130 to be shared between adjacent columns of bitcells (e.g., bitcells 102 and 104 and others). Other suitable configurations which enable a SL to be shared between two or more adjacent columns of bitcells may also be useful.

Referring to FIG. 2A, M2 level is used for each SL instead of M1 level which allows for the increased width of each SL. By having the SLs disposed in M2 level, the design rule restriction of M1 island, active region (RX) spacing and via contact in the CA level to gate spacing issues are avoided. Such configuration allows width (W) of each SL (e.g., SL0 130, SL1 132 and others) to be effectively multiplied by shared number of bitcells or bits with each SL. As a result, effective resistance of SL is lowered by about 50% compared to a conventional bitcell structure that uses a dedicated SL configuration. It is understood that depending on the desired width of SL, other suitable metal levels above M2 may also be used for SL.

One factor in STT-MRAM 100 configuration is the width of the access transistor (e.g., T00 120, T10 122, and others). Increase in the width may improve the write margin. In addition, multiple fingers may be used to reduce the access transistor width and therefore reduce chip size. For example, using 2 fingers may reduce width requirements by half and using 3 fingers may reduce width requirements by about 66%. In an embodiment, a double poly structure 230 may be used to construct the 2 fingers.

The 1T1MTJ bitcell 210 layout dimensions X 240, Y 250 and W 260 may be estimated using SPICE models and general layout design rules. In one example, we have found that the simulation results show that by using a structure based on sharing SL between adjacent columns of bitcells, the SL width W 260 is increased but the overall bitcell size is reduced by about 10% and the SL resistance is reduced by about 50%.

Figure 2B:
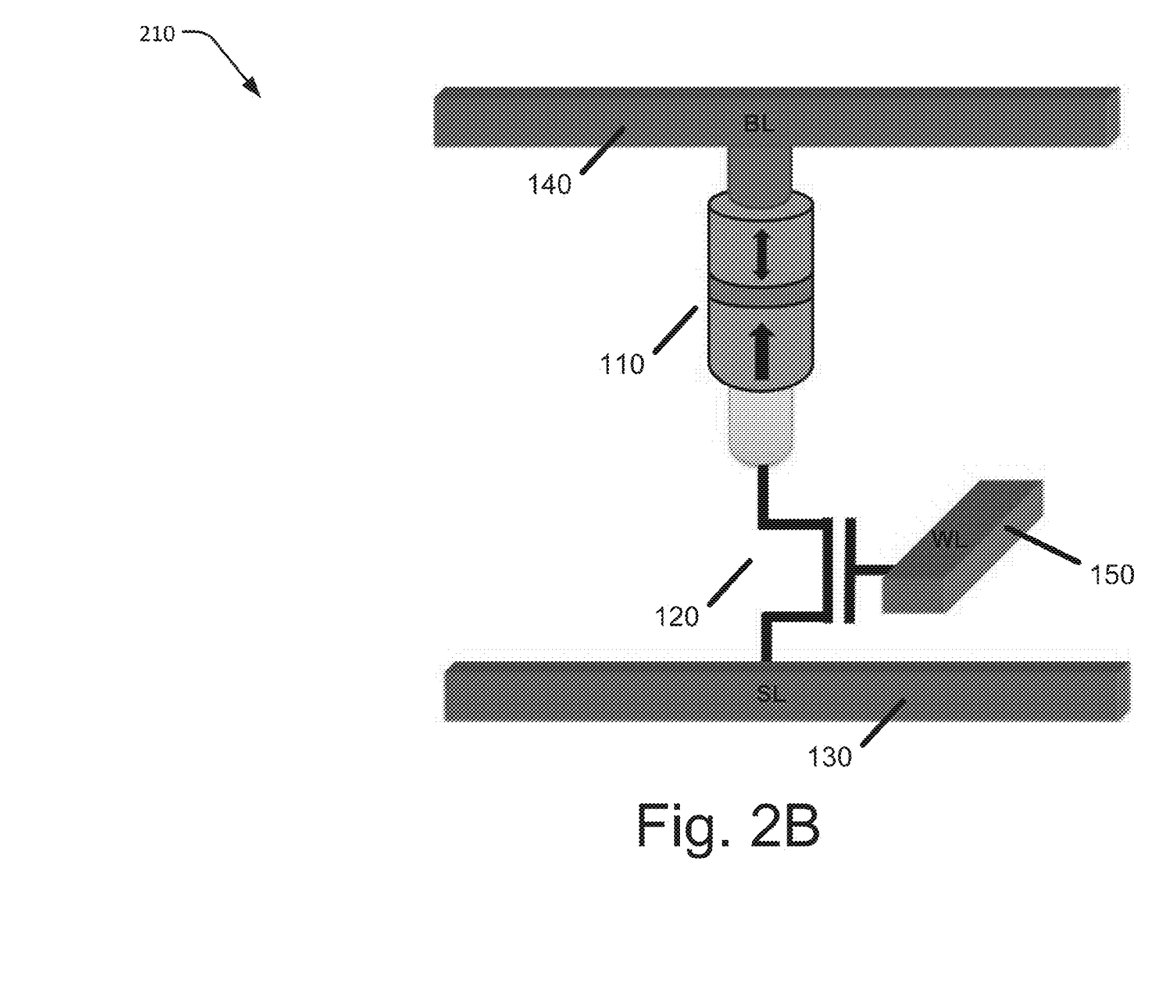
FIG. 2B illustrates simplified cross sectional layer representation of a 1T1MTJ bitcell described with reference to FIG. 2A and bitcell (0,0) described with reference to FIG. 1A.

FIG. 2B illustrates simplified cross sectional layer representation of a 1T1MTJ bitcell 210 described with reference to FIG. 2A and bitcell (0,0) described with reference to FIG. 1A. The MTJ00 110, access transistor T00 120, BL0 140, WL0 150 and SL 130 are illustrated. Read/write circuit (not shown) generates a write voltage between the BL0 140 and the SL0 130 (e.g., at M2 level). Depending on the voltage values between BL0 140 and the SL0 130, the magnetization direction of the free layer of the MTJ00 110 can be changed and correspondingly the logic state H or L can be written to the MTJ00 110. Likewise, during a read operation, a read current is generated, which flows between the BL0 140 and SL0 130 through MTJ00 110. When the current is permitted to flow via the access transistor T00 120, the resistance ($R_{AP}$ or $R_P$) of the MTJ00 110 can be determined based on the voltage differential between the BL0 140 and SL0 130, which is compared to the reference and then amplified by the sense amplifier (SA).

Having low read energy memory devices typically requires a mid-point reference sensing scheme and thereby tighter distributions of MTJ resistances. For mid-point sensing, it may be desired to configure a sigma(R_MTJ) that is less than 6%. However for a given process, sigma(R_MTJ) tends to increase over decreasing MTJ area. Optimized bitcell area and reduced SL resistance of the STT-MRAM 100 may allow MTJ critical dimension (CD) to be reduced below 70 nm while meeting the sigma(R_MTJ) requirement.

As an alternative, a differential sensing scheme with a 2T2MTJ bitcell architecture may be considered to double the read margin for a given sigma(R_MTJ). However, this alternative also doubles the bitcell size, thereby increasing the cost. Hence, this alternative may not be considered as a viable cost-effective option for eFlash replacement, particularly when the memory capacity is relatively large.

It may be desirable to configure the STT-MRAM 100 to provide a large separation between high ($R_{AP}$) and low ($R_P$) resistance states which improves read characteristics for the SA. If present, an overlap between the $R_{AP}$ and $R_P$ states may result in read errors.

As the numbers of bits being shared with one SL increases, the SL width W 260 also increases slightly however SL resistance is significantly decreased. In an embodiment, simulation using SPICE may be performed to compare performance of a bitcell with a dedicated SL structure and the 1T1MTJ 210 bitcell with shared SL//BL structure. The simulated results using SPICE suggest that the SL resistance of the shared SL//BL structure can be significantly high and may not be negligible compared to the MTJ resistance for a bitcell with a dedicated SL structure. The simulated results also suggest for the 1T1MTJ 210 bitcell structure with SL shared between adjacent columns of bitcells, the resistance is reduced by more than 50%, which improves the read margins and reduces sensing errors.

Figure 3:
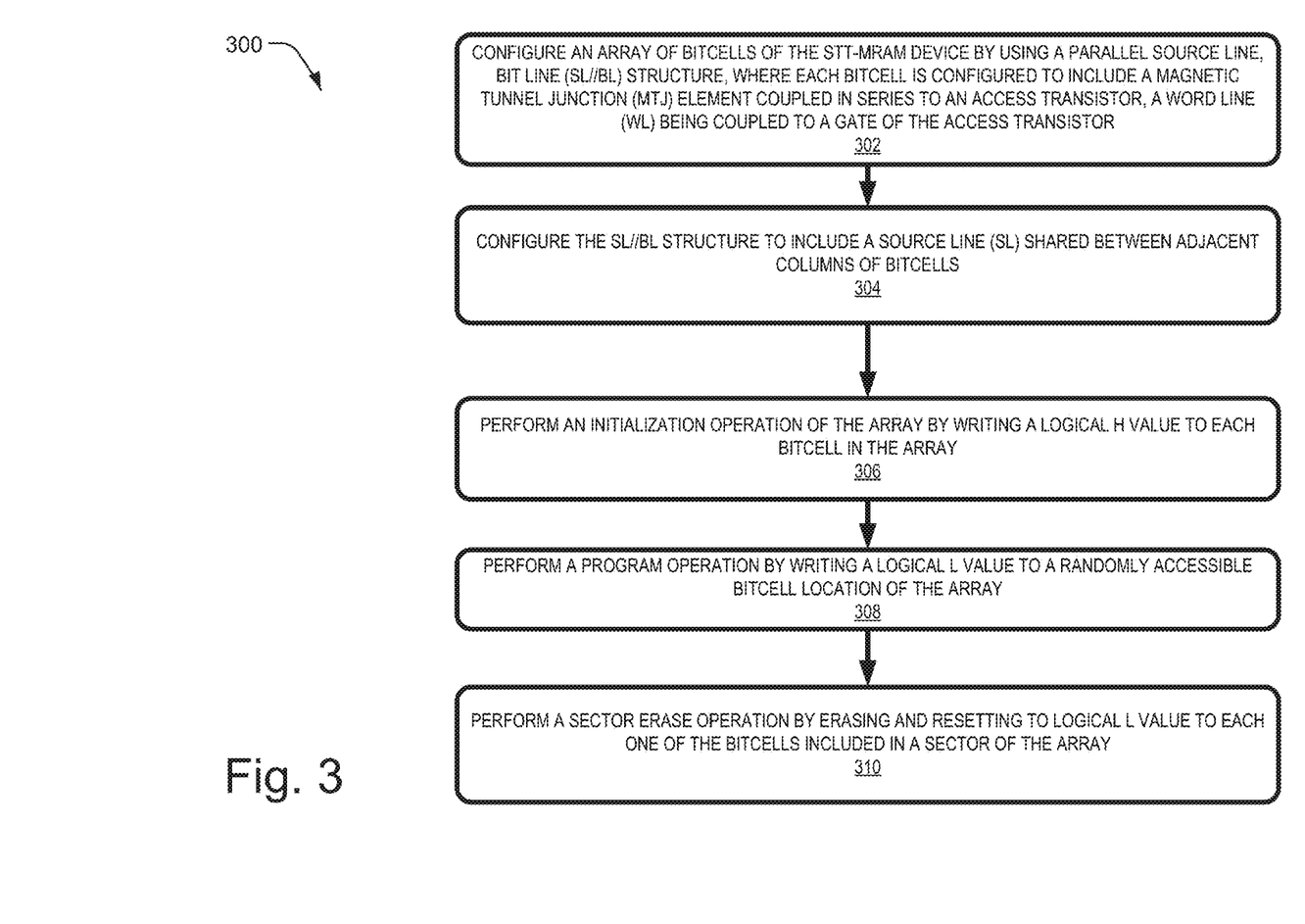
FIG. 3 is a flow diagram illustrating a process to perform eFlash operations in a STT-MRAM device described with reference to FIGS. 1A, 1B, 1C, 1D, 1E, 2A, and 2B.

FIG. 3 is a flow diagram illustrating a process to perform eFlash operations in a STT-MRAM device 100 described with reference to FIGS. 1A, 1B, 1C, 1D, 1E, 2A, and 2B. The process 300 begins at operation 302 in which an array of N×M bitcells of the STT-MRAM 100 device is configured by using a parallel source line, bit line (SL//BL) structure, where each bitcell is configured to include a magnetic tunnel junction (MTJ) cell coupled in series to a drain terminal of an access transistor, and a word line (WL) being coupled to a gate of the access transistor. At operation 304, the SL//BL structure is configured to include a source line (SL) shared between adjacent columns of bitcells.

At operation 306, an initialization operation of the array is performed by writing a logical H value to each bitcell in the array. At operation 308, a program operation is performed by writing a logical L value to a randomly accessible bitcell location of the array. At operation 310, a sector erase operation is performed by erasing and resetting to logical L value to each one of the bits included in a sector of the array. The array is configured to include a plurality of sectors, where the logical H value and the logical L value being binary opposites.

The order in which any process or method described herein is not intended to be construed as a limitation, and any number of the described process blocks can be combined in any order to implement the process, method or alternate method. Additionally, individual blocks may be deleted from the process without departing from the spirit and scope of the subject matter described herein. Furthermore, the process may be implemented in any suitable hardware, software, firmware, or a combination thereof, without departing from the scope of the invention.

The embodiments as described above result in advantages. At 40 nm technology node and above, eFlash is prevalent in many applications ranging from code storage in window controllers to secure key storage in smartcards. However, at advanced technology nodes, finding a viable eFlash solution has been challenging since the traditional floating gate/charge trapping technology used in eFlash may not be scalable below 28 nm. The STT-MRAM 100 device as presented in this disclosure may be configured with a reduced area and improved read margins for the advanced technology node as eFlash replacement applications.

The STT-MRAM 100 device offers smaller cell size, lower SL parasitic resistance for increased read/write (R/W), and perform eFlash operations for use in products/processes that include eFlash memories. The STT-MRAM 100 device also offers a more efficient sector/page erase scheme. In addition, the STT-MRAM 100 device may be implemented with current logic/MRAM technology, with known processes and equipment. In some applications, the STT-MRAM may be configured to operate within a nominal VDD range that is given by an advanced logic technology platform. Hence, the device can operate with much lower power consumption compared to eFlash devices that require additional charge pump circuits to supply high internal voltages for program/erase operations.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A spin transfer torque magnetic random access memory (STT-MRAM) device comprising:
   a first bitline having M number of STT-MRAM cells,
   a second bitline having M number of STT-MRAM cells, wherein
      the first and second bitlines form first and second columns of STT-MRAM cells, and a MRAM cell comprises
         a magnetic tunnel junction (MTJ) element having first and second MTJ terminals, and
         an access transistor having a gate, source and drain terminals, wherein the drain terminal is coupled the first MTJ terminal, providing a series coupling between the access transistor with the MTJ element;
   a plurality of M number of word lines (WLs) coupled to the gate terminals of the access transistors of the STT-MRAM cells, wherein a WL is coupled to one STT-MRAM cell in the first and second bitlines to form a row of STT-MRAM cells, the plurality of M number of WLs form M rows of STT-MRAM cells; and a source line (SL) coupled to the source terminals of the access transistors of the STT-MRAM cells of the first and second columns of STT-MRAM cells, wherein the SL is shared by the first and second columns of STT-MRAM cells and configured at a metal level greater than metal level M1 which is situated above a pre-metal dielectric (PMD) to accommodate an increase in the width of the SL.

2. The STT-MRAM device of claim 1 wherein the SL is configured to be parallel to the first and second bitlines.

3. The STT-MRAM device of claim 2 wherein the first and second columns of STT-MRAM cells form a pair of columns of STT-MRAM cells with a shared SL.

4. The STT-MRAM device of claim 2 wherein during a sector erase operation, the shared SL is driven by suitable voltage within a nominal supply voltage (VDD) range given by an advanced logic technology platform while the first and second bitlines are grounded to erase all the STT-MRAM cells sharing the SL as in an eFlash erase operation.

5. The STT-MRAM device of claim 2, wherein during a program operation, one of the first and second bitlines is driven by suitable voltage within a nominal supply voltage (VDD) range given by an advanced logic technology platform while the shared SL is grounded to allow for selectively writing a logical H value to a randomly accessible STT-MRAM cell as in an eFlash program operation.

6. The STT-MRAM device of claim 2, wherein during an initialization operation, the S number of SLs are driven by suitable voltage within a nominal supply voltage (VDD) range given by an advanced logic technology platform while the first and second bitlines are grounded to allow for writing a logical H value to each STT-MRAM cell.

7. A spin transfer torque magnetic random access memory (STT-MRAM) device having an array of STT-MRAM cells configured as an embedded Flash (eFlash) replacement device, the array comprises:

a plurality of N number of bitlines having M number of MRAM cells, the bitlines forming N columns of MRAM cells, wherein each MRAM cell comprises
a magnetic tunnel junction (MTJ) element having first and second MTJ terminals, and
an access transistor having a gate and source and drain terminals, wherein the drain terminal is coupled the first MTJ terminal, providing a series coupling between the access transistor with the MTJ element;

a plurality of M number of word lines (WLs) coupled to the gate terminals of the access transistors of the STT-MRAM cells of the array, wherein a WL is coupled to one STT-MRAM cell in each of the N bitlines to form a row of STT-MRAM cells, the plurality of M number of WLs form M rows of STT-MRAM cells; and a plurality of S number of source lines (SLs) coupled to the source terminals of the access transistors, wherein a SL of the S number of SLs is shared by or coupled to source terminals of access transistors of two or more adjacent columns of the N columns of STT-MRAM cells and configured at a metal level greater than metal level M1 which is situated above a pre-metal dielectric (PMD) to accommodate an increase in the width of each SL.

8. The STT-MRAM device of claim 7 wherein the SL is configured to be parallel to the bitlines.

9. The STT-MRAM device of claim 7 wherein N is an even number and S is equal to N/2.

10. The STT-MRAM device of claim 7, wherein during a program operation, a bitline of N number of bitlines is driven by suitable voltage within a nominal supply voltage (VDD) range given by an advanced logic technology platform while the shared SL is grounded to allow for selectively writing a logical L value to a randomly accessible STT-MRAM cell of the array as in an eFlash program operation.

11. The STT-MRAM device of claim 10, wherein a uni-directional current is used to perform the program operation.

12. The STT-MRAM device of claim 7 wherein during a sector erase operation, the shared SL is driven by suitable voltage within a nominal supply voltage (VDD) range given by an advanced logic technology platform while the bitlines are grounded to erase all the STT-MRAM cells sharing the SL as in an eFlash erase operation.

13. The STT-MRAM device of claim 12 where the STT-MRAM cells sharing the SL are erased and reset to a logical L value during the sector erase operation.

14. The STT-MRAM device of claim 13, wherein the sector erase operation is enabled by asserting the WL in sequence for each WL included in the sector.

15. The STT-MRAM device of claim 7, wherein during an initialization operation, the S number of SLs are driven by suitable voltage within a nominal supply voltage (VDD) range given by an advanced logic technology platform while the N number of bitlines are grounded to allow for writing a logical H value to each STT-MRAM cell in the array.

16. The STT-MRAM device of claim 7, wherein a width of the SL is effectively multiplied by shared number of STT-MRAM cells with each SL.

17. A spin transfer torque magnetic random access memory (STT-MRAM) device having an array of STT-MRAM cells configured as an embedded Flash (eFlash) replacement device, the array comprises:

a plurality of N number of bitlines having M number of MRAM cells, the bitlines forming N columns of MRAM cells, wherein each MRAM cell comprises
a magnetic tunnel junction (MTJ) element having first and second MTJ terminals, and
an access transistor having a gate and source and drain terminals, wherein the drain terminal is coupled the first MTJ terminal, providing a series coupling between the access transistor with the MTJ element;

a plurality of M number of word lines (WLs) coupled to the gate terminals of the access transistors of the STT-MRAM cells of the array, wherein a WL is coupled to one STT-MRAM cell in each of the N bitlines to form a row of STT-MRAM cells, the plurality of M number of WLs form M rows of STT-MRAM cells;

a plurality of S number of source lines (SLs) coupled to the source terminals of the access transistors, wherein a SL of the S number of SLs is shared by or coupled to source terminals of access transistors of two or more adjacent columns of the N columns of STT-MRAM cells and configured at a metal level greater than metal level M1 which is situated above a pre-metal dielectric (PMD) to accommodate an increase in the width of each SL; and the source terminals of adjacent access transistors of the same bitline are a common source terminal to form a pair of STT-MRAM cells of a bitline.

18. The STT-MRAM device of claim 17 wherein M is an even number and a bitline has M/2 STT-MRAM cell pairs.

19. A method of forming a spin transfer torque magnetic random access memory (STT-MRAM) device comprising:
forming an array of STT-MRAM cells configured as an embedded Flash (eFlash) replacement device, wherein forming the array comprises
forming a plurality of N number of bitlines having M number of MRAM cells, the bitlines forming N columns of MRAM cells, wherein each MRAM cell comprises
a magnetic tunnel junction (MTJ) element having first and second MTJ terminals, and
an access transistor having a gate and source and drain terminals, wherein the drain terminal is coupled the first MTJ terminal, providing a series coupling between the access transistor with the MTJ element,
forming a plurality of M number of word lines (WLs) coupled to the gate terminals of the access transistors of the STT-MRAM cells of the array, wherein a WL is coupled to one STT-MRAM cell in each of the N bitlines to form a row of STT-MRAM cells, the plurality of M number of WLs form M rows of STT-MRAM cells,
forming a plurality of S number of source lines (SLs) coupled to source terminals of the access transistors, wherein a SL of the S number of SLs is shared by or coupled to source terminals of access transistors of two or more adjacent columns of the N columns of STT-MRAM cells and configured at a metal level greater than metal level M1 which is situated above a pre-metal dielectric (PMD) to accommodate an increase in the width of each SL.

20. The method of claim 19 wherein the S number of SLs are configured to be parallel to the N number of bitlines.

* * * * *